United States Patent
Park et al.

(10) Patent No.: US 7,590,011 B2
(45) Date of Patent: Sep. 15, 2009

(54) MEMORY CARD, DATA DRIVING METHOD THEREOF, AND MEMORY CARD SYSTEM INCLUDING THE SAME

(75) Inventors: Sung-Ho Park, Seoul (KR); Sam-Yong Bahng, Seongnma-si (KR); Seok-Won Heo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 243 days.

(21) Appl. No.: 11/670,285

(22) Filed: Feb. 1, 2007

(65) Prior Publication Data

US 2007/0274137 A1   Nov. 29, 2007

(30) Foreign Application Priority Data

Feb. 1, 2006   (KR) .................... 10-2006-0009777

(51) Int. Cl.
  *G11C 5/14* (2006.01)
(52) U.S. Cl. .................. 365/189.09; 365/189.08; 365/230.06
(58) Field of Classification Search ............ 365/189.05, 365/189.08, 226, 189.09, 191, 189.15, 189.16, 365/230.06
See application file for complete search history.

(56) References Cited

U.S. PATENT DOCUMENTS

| | | | | |
|---|---|---|---|---|
| 5,572,478 A | * | 11/1996 | Sato et al. | 365/226 |
| 5,745,426 A | * | 4/1998 | Sekiyama | 365/226 |
| 5,889,722 A | * | 3/1999 | Numazaki et al. | 365/226 |
| 5,956,270 A | * | 9/1999 | Shimomura et al. | 365/185.18 |
| 6,971,582 B2 | * | 12/2005 | Kim | 235/492 |
| 6,982,919 B2 | * | 1/2006 | Kumahara et al. | 365/226 |
| 7,453,741 B2 | * | 11/2008 | Kim et al. | 365/189.09 |
| 2004/0215996 A1 | | 10/2004 | Kanamori et al. | |
| 2007/0008801 A1 | * | 1/2007 | Chiang et al. | 365/226 |

FOREIGN PATENT DOCUMENTS

KR    1020050022651    3/2005

OTHER PUBLICATIONS

English Abstract for Publication No. 1020050022651 A, Mar. 8, 2005.
Riikonen, J., Si and III-V Multiplexers Si ja III-V Multiplekserit; HUT, ECDL, S-87.198 Postgraduate Course in Electronic Circuit Design II, Apr. 21, 2005, pp. 1-18.

* cited by examiner

*Primary Examiner*—Tuan T Nguyen
*Assistant Examiner*—Hien N Nguyen
(74) *Attorney, Agent, or Firm*—F. Chau & Associates, LLC

(57) ABSTRACT

A memory card including a pad, a drive circuit activating the pad in accordance with an input signal, and a controller regulating a drive voltage level and a drive point of an output signal generated from the drive circuit in accordance with a voltage level of the output signal of the drive circuit. The controller may include a delay circuit, generating a second clock signal by delaying a first clock signal provided from an external source and generating a second clock signal from the first clock signal. The controller may further include a detection circuit capturing the voltage level of the output signal of the drive circuit as a first detection voltage in sync with the first clock signal and capturing the voltage level of the output signal of the drive circuit as a second detection voltage in sync with the second dock signal. The controller may additionally include a drive control circuit regulating the drive voltage level and the drive point of the output signal of the drive circuit in response to the first and second detection voltages.

16 Claims, 5 Drawing Sheets

MEMORY CARD, DATA DRIVING METHOD THEREOF, AND MEMORY CARD SYSTEM INCLUDING THE SAME

CROSS-REFERENCE TO RELATED PATENT APPLICATION

This application claims priority to Korean Patent Application No. 2006-09777, filed on Feb. 1, 2006, the disclosure of which is incorporated by reference herein.

BACKGROUND OF THE INVENTION

1. Technical Field

The present disclosure relates to semiconductor devices and more particularly, to a memory card for controlling the drivability of a data drive circuit in accordance with a host and a method of driving the same.

2. Discussion of the Related Art

Due to advancements in technology, portable electronic devices are being equipped with functions in addition to their primary purpose. For example, a mobile phone may be provided with a camcorder function of taking motion pictures and a camera function of taking still pictures in addition to its inherent telephonic function. Such electronic devices generally require a large capacity storage unit to smoothly process the additional functions.

Portable electronic devices often use NAND flash memories to satisfy their large storage requirements. A NAND flash memory is a kind of nonvolatile memory which is typically present on a separable card (hereinafter, referred to as 'memory card') which can be inserted into the corresponding portable electronic device. For example, many commercial cards, such as the Multimedia card (MMC), the Secure digital (SD) card, the Smartmedia card, and the Compact flash card, are used as data storage units for digital cameras, MP3 players, personal digital assistants (PDA), handheld personal computers, gaming machines, facsimile telegraphs, scanners, and printers (hereinafter, referred to as 'hosts').

A memory card is usually conditioned in various environments of operation in accordance with a variety of hosts. It is important to offer compatibility of interface between the memory card and the host. For example, the memory card and host need to agree on setup/hold times for transceiving data between the them. Conventionally, such agreements are accomplished by using a drive-point delaying method at an output terminal during the design of the memory card. But, this is a cumbersome process because test operations are carried out with hosts that are practically operable with the memory card. Further, as terminal resistance and capacitance on data transmission lines between the host and the memory card vary in accordance with the type of host, it becomes difficult to optimally control the data drivability of the memory card.

Therefore, a need exists for a memory card which can control its data drivability.

SUMMARY OF THE INVENTION

An exemplary embodiment of the present invention is a memory card comprising a pad, a drive circuit activating the pad in accordance with an input signal, and a controller regulating a drive point and a drive voltage level of an output signal of the drive circuit in accordance with a voltage level of the output signal.

The controller may further comprise a delay circuit delaying a first clock signal provided from an external source and generating a second clock signal from the first clock signal, a detection circuit capturing a voltage level of the output signal of the drive circuit as a first detection voltage in sync with the first clock signal and capturing a voltage level of the output signal of the drive circuit as a second detection voltage in sync with the second clock signal, and a drive control circuit regulating the drive point and voltage level of the output signal of the drive circuit in response to the first and second detection voltages.

When the first detection voltage is higher than the second detection voltage, the drive control circuit may regulate the drive circuit to delay the drive point and to decrease the drive voltage level. Alternatively, when the first detection voltage is lower than the second detection voltage, the drive control circuit may regulate the drive circuit to delay the drive point and to increase the drive voltage level.

An exemplary embodiment of the present invention is a method of driving data in a memory card having a drive circuit for activating a signal to be transferred to a host. The method includes the steps of capturing a voltage level of a signal, which is output from the drive circuit, as a first detection voltage in response to an external clock signal transferred from the host, capturing a voltage level of the signal output from the drive circuit, as a second detection voltage in response to a delay clock signal of the external clock signal, and adjusting a drive point and a drive voltage level of the signal output from the drive circuit in accordance with whether the first detection voltage is higher than the second detection voltage.

An exemplary embodiment of the present invention is a memory card system comprising a host, and a memory card configured to be connectable with the host. The memory card comprises a memory; a pad coupled to the host through a transmission line, a drive circuit activating the pad in accordance with data output from the memory, a delay circuit delaying a first clock signal, which is provided from the host, in sync with strobe timing of the host and generating a second clock signal from the first clock signal, a detection circuit capturing a voltage level of an output signal of the drive circuit as a first detection voltage generated in response to a transition of the first clock signal and capturing a voltage level of the output signal of the drive circuit as a second detection voltage in response to a transition of the second clock signal, and a drive control circuit adjusting a drive point and a drive voltage level of the output signal of the drive circuit in accordance with whether the first detection voltage is higher than the second detection voltage.

BRIEF DESCRIPTION OF THE DRAWINGS

The above and other features of the present invention will become readily apparent by describing in detail exemplary embodiments thereof with reference to the attached drawings in which.

DETAILED DESCRIPTION OF EXEMPLARY EMBODIMENTS

The present invention will be described below in more detail with reference to the accompanying drawings. The present invention may, however, be embodied in different forms and should not be construed as limited to the embodiments set forth herein.

Figure 1:
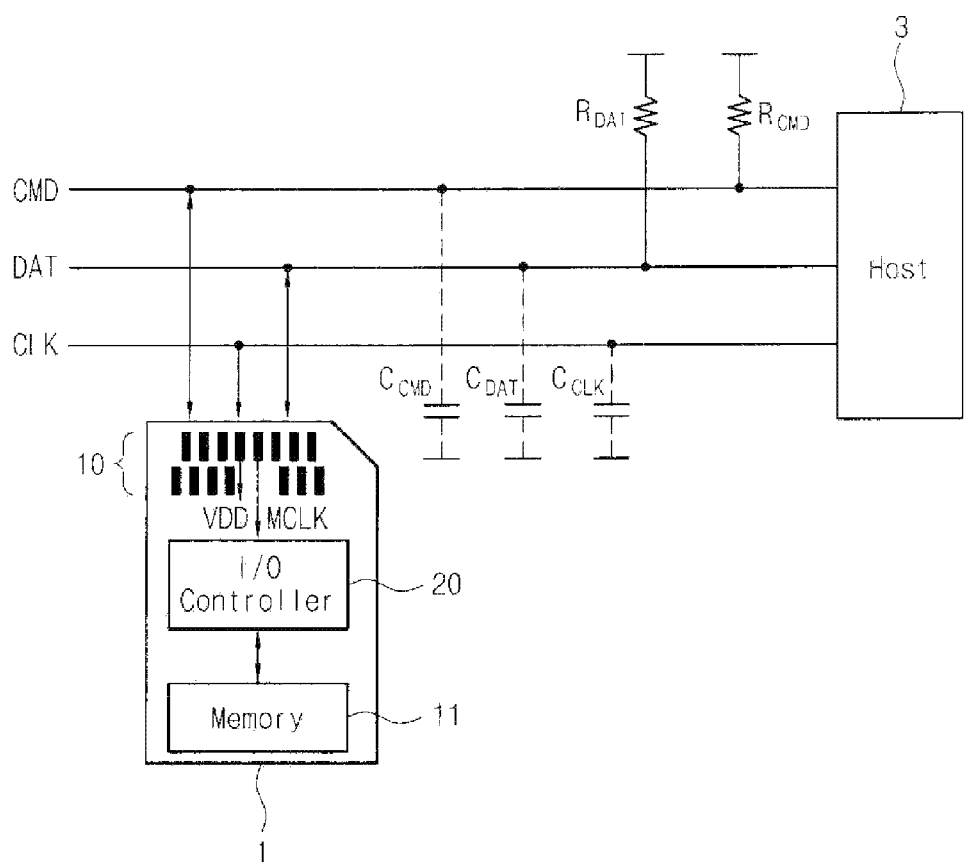
FIG. 1 is a schematic diagram illustrating a memory card system according to an exemplary embodiment of the present invention.

FIG. 1 is a schematic diagram illustrating a memory card system in accordance with an exemplary embodiment of the present invention. Referring to FIG. 1, a memory card 1 is comprised of input/output pads 10, an I/O controller 20, and a memory 11. The memory card may be, for example, a multimedia card (MMC). The input/output pads 10 may be, for example, DAT pads, a CMD pad, a VDD pad, a VSS pad, and CLK pad. The DAT pads are terminals for transceiving data with a host 3 through a data transmission line DAT. The CLK pad is a terminal for receiving a clock signal MCLK, which activates an operation of the memory card, from the host 3 through a clock transmission line CLK. The CMD pad is a terminal for receiving control commands from the host 3 through a command transmission line CMD. The control commands are referred to as commands for controlling the memory card in reading and writing data to and from the memory 11. The VDD pad is a terminal for accepting a DC voltage from the host 3. The VSS pad acts as a ground terminal to the DC voltage. Additionally, the memory card 1 may also include spare pads which provide a function specified by a user.

When the memory card 1 is exchanging various signals or data with the host 3 by way of the transmission lines CLK, DAT, and CMD, the termination resistors RDAT and RCMD and capacitive components CDAT, CCMD, and CCLK may each have an effect on signal transmission. Thus, in designing the memory card 1, the termination resistors may be adjusted to match impedance between reception and transmission sides connected through the transmission lines. Considering that capacitive components at an output terminal of the memory card 1 vary in accordance with the type of the host 3, the drivability (i.e., drive point and voltage level) needs to be adjusted at an output terminal of a transmission side. However, it is difficult to control the drivability of the output terminal of the memory card 1 respective to all types of hosts, as they may be numerous.

Figure 2:
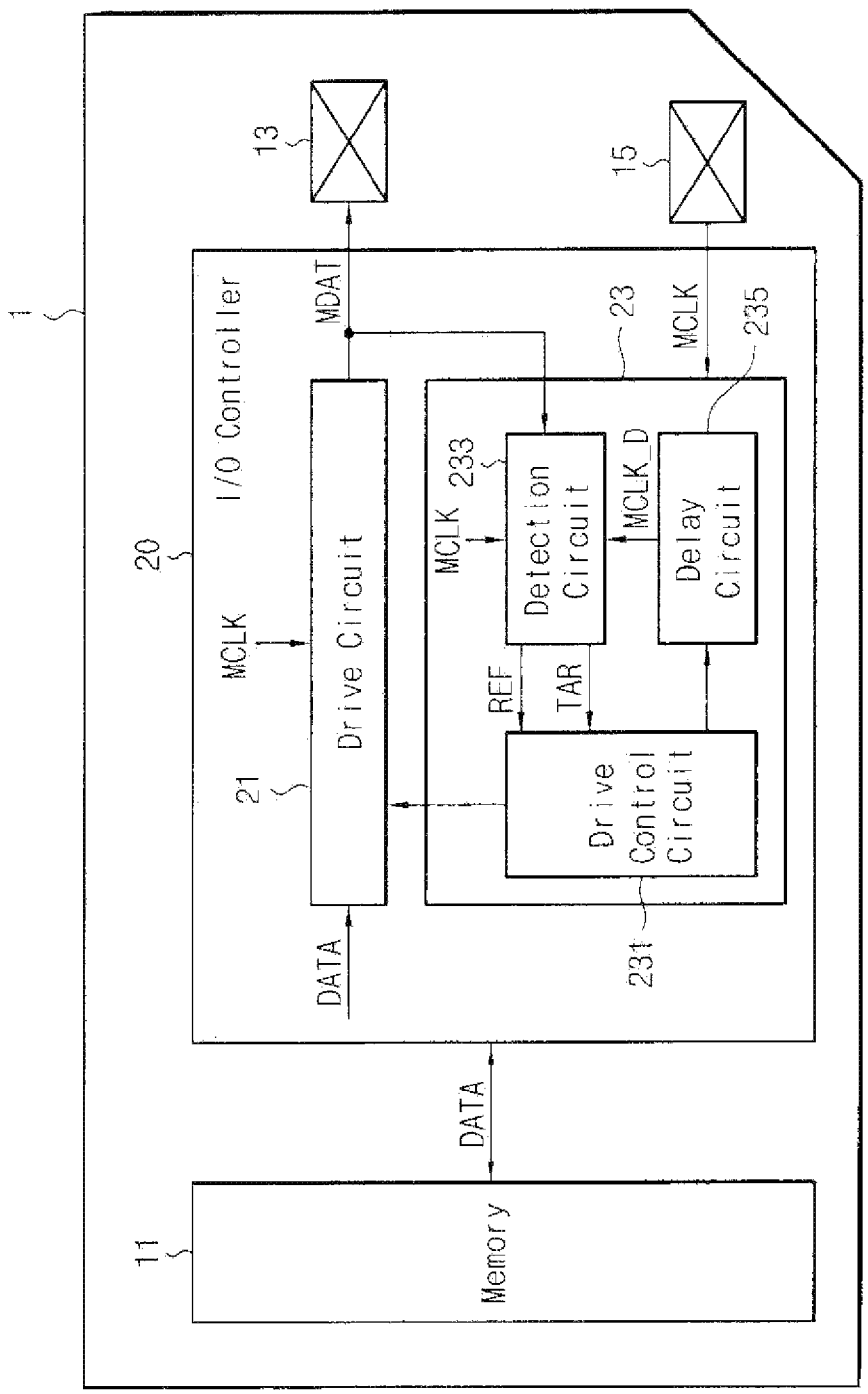
FIG. 2 is a block diagram illustrating an exemplary embodiment of the memory card shown in FIG. 1.

FIG. 2 is a block diagram illustrating a memory card shown in FIG. 1. Referring to FIG. 2, the I/O controller 20 includes a drive circuit 21 and a drive circuit controller 23. The memory card 1 reads data DATA from the memory 11 in compliance with the control command provided from the host 1. The data DATA read from the memory 11 is input to the drive circuit 21 of the I/O controller 20. The drive circuit 21 outputs data MDAT in sync with the clock signal MCLK. The data MDAT output from the drive circuit 21 is transferred to the host 3 through an input/output pad 13 coupled to the transmission line DAT. A controller (not shown) of the host 3 accepts the data MDAT from the memory card 1 based on a strobe timing STB.

Figure 3:
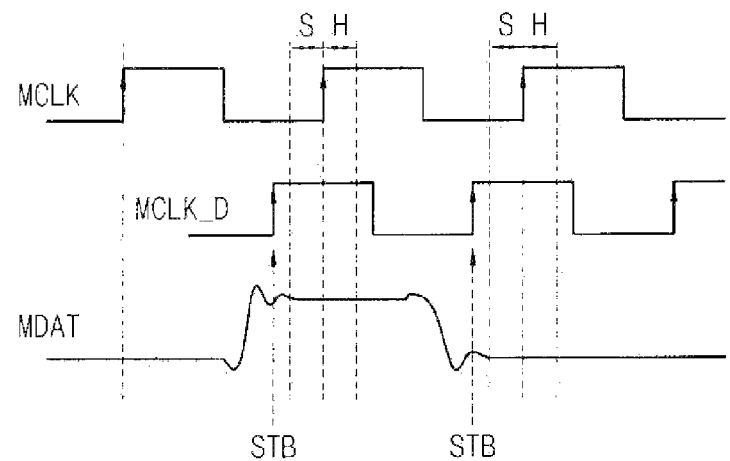
FIG. 3 is a timing diagram showing an operational feature of the memory card in accordance with an exemplary embodiment of the present invention.

The drive circuit controller 23 includes a drive control circuit 231, a detection circuit 233, and a delay circuit 235. An operation of a memory card operated by the drive circuit controller 23 will be discussed in conjunction with FIGS. 2 and 3. FIG. 3 is a timing diagram showing an operational feature of the memory card in accordance with an exemplary embodiment of the present invention.

The delay circuit 235 of the drive circuit controller 23 accepts the clock signal MCLK from the host 3 through a clock input pad 15. The delay circuit 235 generates an internal clock signal MCLK_D by delaying the clock signal MCLK, which is transferred from the host 3, for a predetermined time. During the predetermined time, the delay circuit 235 delays the clock signal MCLK so it operates in sync with the strobe timing STB.

The detection circuit 233 is coupled to an output terminal (e.g., the pad 13) of the drive circuit 21, accepting the data MDAT output from the drive circuit 21. The detection circuit 233 detects the output data MDAT in sync with the internal clock signal MCLK_D and the clock signal MCLK provided from the host 3. The detection circuit 233 captures the output data MDAT of the drive circuit 21 in sync with a rising edge of the clock signal MCLK. The detection circuit 233 also captures the output data MDAT of the drive circuit 21 in sync with a rising edge of the internal clock signal MCLK_D. Here, the rising edge of the internal clock signal MCLK_D is substantially identical to the strobe timing STB of the host 3. For example, the detection circuit 233 may include two flip flops (not shown) for accepting an output of the drive circuit 21 in sync with the clock signal MCLK or the internal clock signal MCLK_D. When this occurs, one of the flip flops accepts the output data MDAT from the drive circuit 21 in sync with the clock signal MCLK, while the other accepts the output data MDAT from the drive circuit 21 in sync with the internal clock signal MCLK_D. Hereinafter, the output data MDAT captured in sync with the clock signal MCLK by the detection circuit 233 is referred to as reference value REF, while the output data MDAT captured in sync with the internal clock signal MCLK_D by the detection circuit 233 is referred to as target value TAR.

The drive control circuit 231 compares the reference value REF with the target value TAR. The comparison result is used to control the drivability of the drive circuit 21, e.g., a drive point and a drive voltage level.

Figure 4:
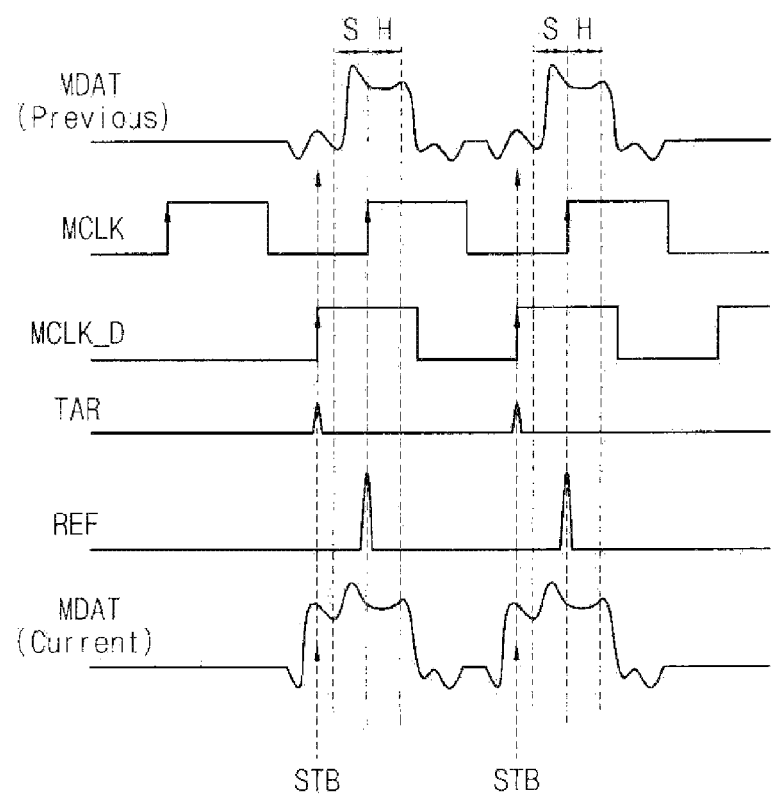
FIGS. 4 through 6 are timing diagrams showing operational features of the drive circuit controller shown in FIG. 2.
Figure 5:
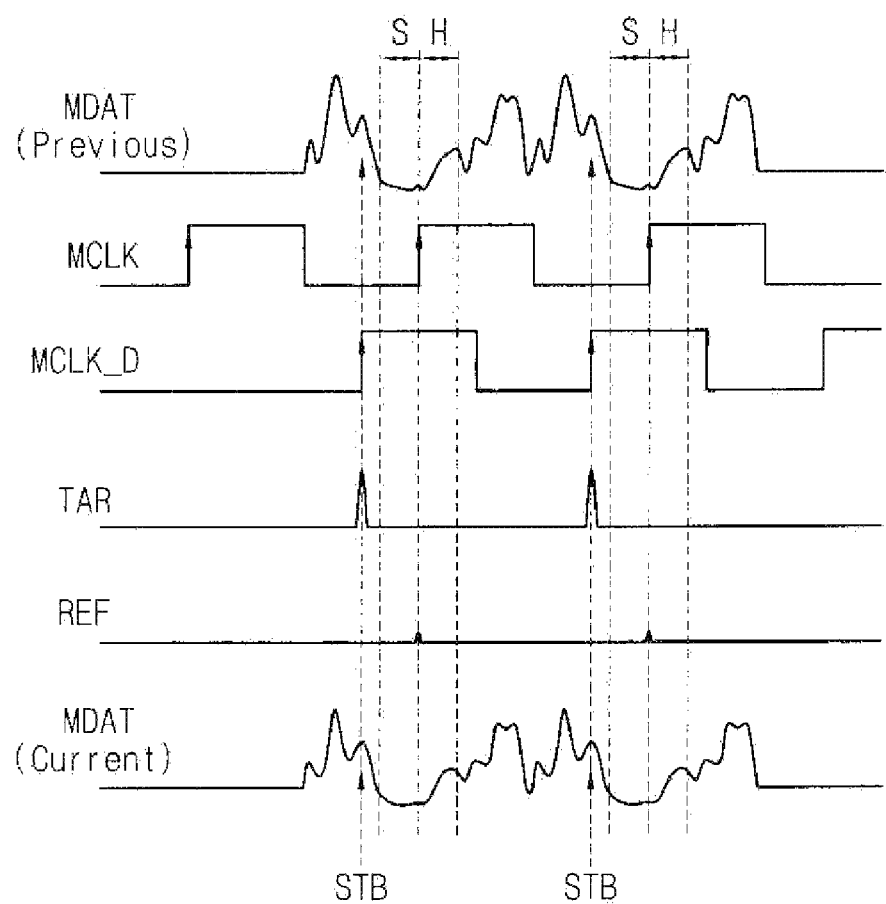
Figure 6:
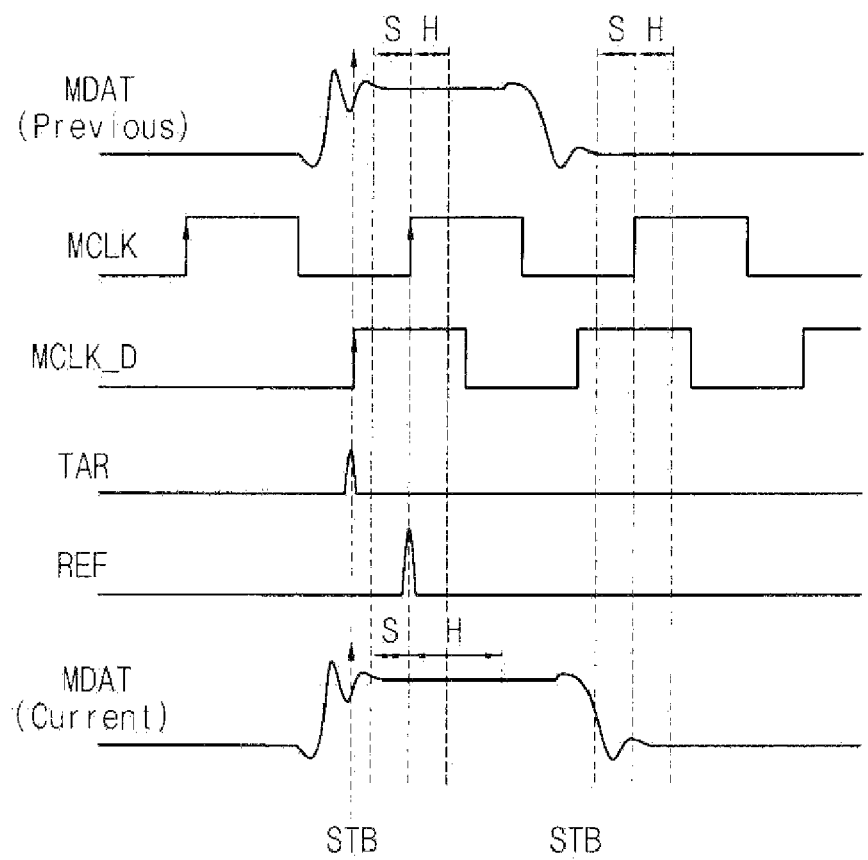

FIGS. 4 through 6 are timing diagrams showing operational features for controlling the drive circuit controller shown in FIG. 2.

The data DATA is read out from the memory 11 by a memory controller (not shown) in the memory card 1 in compliance with the control command provided from the host 3. The data DATA read out from the memory 11 is input to the I/O controller 20. The drive circuit 21 of the I/O controller 20 outputs the data DATA to the data pad 13 in sync with the clock signal MCLK supplied from the host 3. During the output, the detection circuit 223 of the drive circuit controller 23 captures and transfers the reference values REF to the drive control circuit 231 in sync with the clock signal MCLK. Further, the detection circuit 233 captures and transfers the reference values REF to the drive control circuit 231 in sync with the internal clock signal MCLK_D provided from the delay circuit 235. The drive control circuit 231 compares the reference value REF with the target value TAR in voltage level. If the target value TAR is lower than the reference value REF, as illustrated in FIG. 4, the drive circuit 21 is controlled to raise an output voltage level of the data MDAT. At substantially the same time, as shown in FIG. 6, the drive control circuit 231 regulates the drive circuit 21 to delay a drive point of the data MDAT. This results in a delay of the drive point in the output data MDAT of the drive control circuit 231.

If the target voltage TAR is higher than the reference value REF in voltage level as shown in FIG. 5, the drive control circuit 231 regulates the drive circuit 21 to lower a drive voltage level of the data MDAT. At substantially the same time, the drive control circuit 231 regulates the drive circuit 21 to delay a drive point of the data MDAT. As illustrated in FIG. 6, by delaying the drive point of the data MDAT of the drive circuit 21, the output data MDAT becomes longer in pulse width and thereby a hold time H becomes longer.

The drive control circuit 231 is able to adjust (increases or decreases) the drive voltage level of the drive circuit 21, as well as control the drive point thereof to be delayed at substantially the same time or in sequence. The drive circuit controller 23 compares the reference value REF with the target value TAR that is set by capturing an output of the drive circuit 21 in sync with the strobe timing STB of the host 3. From the result of comparison, the drive circuit controller 23 adjusts the drive voltage level and point of the drive circuit 21. The drive circuit controller 23 may set the drive voltage level of the drive circuit 21 as the maximum value at the first and then delay the drive point by decreasing the drive voltage level in accordance with the results of the detection and comparison. Alternatively, the drive circuit controller 23 may set the drive voltage level of the drive circuit 21 as the minimum value at the first, and then delay the drive point by raising the drive voltage level in accordance with the results of the detection and comparison.

The drive circuit controller 23 may be able to adjust (delay) a data output time of the drive circuit 21 by units of 2 ns. The drive circuit controller 23 may also be able to selectively control the drivability of the drive circuit 21 by either delaying the drive point or adjusting the drive voltage level, as necessary.

At least one embodiment of the present invention implements a hardware structure capable of adjusting the drivability (i.e., the drive point and voltage level) of the drive circuit 21 of the memory card 1 in accordance with the type of the host 3 communicating data with the memory card 1. Therefore, it is possible to control the hold time and to enhance the compatibility of interface based on the characteristics of numerous hosts employing the memory card 1.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory card comprising:
a pad;
a drive circuit activating the pad in accordance with an input signal; and
a controller capturing a voltage level of an output signal of the drive circuit as a first detection voltage in sync with a first clock signal and capturing a voltage level of the output signal of the drive circuit as a second detection voltage in sync with a second clock signal, and regulating a drive point and a drive voltage level of the output signal of the drive circuit in accordance with the first and second detection voltages.

2. The memory card as set forth in claim 1, wherein the controller comprises:
a delay circuit delaying the first clock signal provided from an external source and generating the second clock signal from the first clock signal;
a detection circuit capturing the voltage level of the output signal of the drive circuit as the first detection voltage in sync with the first clock signal and capturing the voltage level of the output signal of the drive circuit as the second detection voltage in sync with the second clock signal; and
a drive control circuit regulating the drive point and voltage level of the output signal of the drive circuit in response to the first and second detection voltages.

3. The memory card as set forth in claim 2, wherein when the first detection voltage is higher than the second detection voltage, the drive control circuit regulates the drive circuit to delay the drive point and to decrease the voltage level of the output signal.

4. The memory card as set forth in claim 2, wherein when the first detection voltage is lower than the second detection voltage, the drive control circuit regulates the drive circuit to delay the drive point and to increase the voltage level of the output signal.

5. The memory card as set forth in claim 2, wherein the second clock signal is delayed to be in sync with strobe timing of a host.

6. The memory card as set forth in claim 1, adapted to form a multimedia card.

7. The memory card as set forth in claim 1, which further comprises a memory storing data, wherein the input signal provided to the drive circuit is the data read from the memory.

8. A method of driving data in a memory card having a drive circuit for activating a signal to be transferred to a host, the method comprising:
capturing a voltage level of a signal, which is output from the drive circuit, as a first detection voltage in response to an external clock signal transferred from the host;
capturing a voltage level of the signal output from the drive circuit, as a second detection voltage in response to a delay clock signal of the external clock signal; and
adjusting a drive point and a drive voltage level of the signal output from the drive circuit in accordance with whether the first detection voltage is higher than the second detection voltage.

9. The method as set forth in claim 8, wherein when the first detection voltage is higher than the second detection voltage, the drive point is delayed and the drive voltage level is decreased.

10. The method as set forth in claim 8, wherein when the first detection voltage is lower than the second detection voltage, the drive point is delayed and the drive voltage level is increased.

11. The method as set forth in claim 8, wherein the delay clock signal is delayed to be in sync with strobe timing of the host.

12. A memory card system comprising:
a host; and
a memory card configured to be connectable with the host, wherein the memory card comprises:
a memory;
a pad coupled to the host through a transmission line;
a drive circuit activating the pad in accordance with data output from the memory;
a delay circuit delaying a first clock signal, which is provided from the host, in sync with strobe timing of the host and generating a second clock signal from the first clock signal;
a detection circuit capturing a voltage level of an output signal of the drive circuit as a first detection voltage generated in response to a transition of the first clock signal and capturing a voltage level of the output signal of the drive circuit as a second detection voltage in response to a transition of the second clock signal; and
a drive control circuit adjusting a drive point and a drive voltage level of the output signal of the drive circuit in accordance with whether the first detection voltage is higher than the second detection voltage.

13. The memory card system as set forth in claim 12, wherein when the first detection voltage is higher than the second detection voltage, the drive control circuit regulates the drive circuit to delay the drive point and to decrease the voltage level of the output signal.

14. The memory card system as set forth in claim 12, wherein when the first detection voltage is lower than the second detection voltage, the drive control circuit regulates the drive circuit to delay the drive point and to increase the voltage level of the output signal.

15. The memory card system as set forth in claim 12, wherein the memory card is a multimedia card.

16. A memory card comprising:
   a pad;
   a drive circuit activating the pad in accordance with an input signal; and
   a controller regulating a drive point and a drive voltage level of an output signal of the drive circuit in accordance with a voltage level of the output signal,
wherein the controller comprises:
   a delay circuit delaying a first clock signal provided from an external source and generating a second clock signal from the first clock signal;
   a detection circuit capturing a voltage level of the output signal of the drive circuit as a first detection voltage in sync with the first clock signal and capturing a voltage level of the output signal of the drive circuit as a second detection voltage in sync with the second clock signal; and
   a drive control circuit regulating the drive point and voltage level of the output signal of the drive circuit in response to the first and second detection voltages.

* * * * *